(12) United States Patent
Watanabe et al.

(10) Patent No.: US 7,425,747 B2
(45) Date of Patent: Sep. 16, 2008

(54) SEMICONDUCTOR DEVICE

(75) Inventors: Atsushi Watanabe, Kadoma (JP);
Katsushi Tara, Kyoto (JP); Kenichi Hidaka, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 23 days.

(21) Appl. No.: 10/910,328

(22) Filed: Aug. 4, 2004

(65) Prior Publication Data

US 2005/0030084 A1    Feb. 10, 2005

(30) Foreign Application Priority Data

Aug. 5, 2003    (JP) .............................. 2003-287019

(51) Int. Cl.
*H01L 29/76* (2006.01)
(52) U.S. Cl. ...................... 257/379; 257/528; 257/532
(58) Field of Classification Search ................... 257/379
See application file for complete search history.

(56) References Cited

U.S. PATENT DOCUMENTS

| | | | |
|---|---|---|---|
| 6,308,047 B1 | 10/2001 | Yamamoto et al. | |
| 6,384,701 B1 | 5/2002 | Yamada et al. | |
| 6,676,602 B1 * | 1/2004 | Barnes et al. | 600/443 |
| 6,815,796 B2 | 11/2004 | Ota et al. | |
| 6,815,810 B2 | 11/2004 | Takehara et al. | |
| 6,818,979 B2 | 11/2004 | Takehara et al. | |
| 2005/0040522 A1 | 2/2005 | Takehara et al. | |

FOREIGN PATENT DOCUMENTS

| | | |
|---|---|---|
| JP | 05-075314 | 3/1993 |
| JP | 09-283693 | 10/1997 |
| JP | 11-55156 | 2/1999 |
| JP | 11-144012 | 5/1999 |
| JP | 11-330163 | 11/1999 |
| JP | 2000-68807 | 3/2000 |
| JP | 2000-0029796 | 5/2000 |
| JP | 2001-148457 | 5/2001 |
| JP | 2003-124435 | 4/2003 |
| JP | 2003-234411 | 8/2003 |

* cited by examiner

*Primary Examiner*—Long Pham
(74) *Attorney, Agent, or Firm*—Wenderoth, Lind & Ponack, L.L.P.

(57) ABSTRACT

The present invention provides a miniaturized semiconductor device at low-cost having high integration density and for restraining an increase of an insertion loss and a deterioration of an isolation characteristic of a circuit resulting from parasitic inductance of gold wires. The semiconductor device includes a control semiconductor chip, a switch circuit semiconductor chip, a substrate, external terminals, gold wires and MIM capacitors. The control semiconductor chip controls a high frequency signal processing by the switch circuit semiconductor chip 111. The switch circuit semiconductor chip is mounted on the control semiconductor chip and processes the high frequency signal. The control semiconductor chip is mounted on the substrate. The external terminals are interfaces with the outside. The gold wires connect among the control semiconductor chip, the switch circuit semiconductor chip and the external terminals. The MIM capacitors are formed on the control semiconductor chip and the inside of the substrate, and process the high frequency signal.

10 Claims, 5 Drawing Sheets

SEMICONDUCTOR DEVICE

BACKGROUND OF THE INVENTION (1) Field of the Invention

The present invention relates to a semiconductor device. In particular, the present invention relates to a semiconductor integrated circuit component that is used for a communication device, a radio equipment and the like.

(2) Description of the Related Art

In recent years, a high frequency signal is mostly used for the communication device and the radio equipment, and a field effect transistor (hereafter referred to as FET) using gallium arsenide (hereafter referred to as GaAs) which has a good high frequency characteristic is used for a switch circuit of the semiconductor integrated circuit component included in the communication device and the radio equipment.

FIG. 1A is a functional block diagram showing an internal structure of the conventional semiconductor integrated circuit component (refer to Japanese Laid-Open Patent Publication application No. 11-144012).

The semiconductor integrated circuit component is composed of a control unit 600, a signal processing unit 601 and terminals 602. The control unit 600 controls the signal processing unit 601 based on a control signal inputted from the outside. The signal processing unit 601 is connected to the control unit 600 and performs a switching operation of a high frequency signal. The terminals 602 are interfaces between the control unit 600 and the signal processing unit 601, and the outside.

FIG. 1B is an external drawing of the semiconductor integrated circuit component.

The conventional semiconductor integrated circuit component includes a control semiconductor chip 610, a switch circuit semiconductor chip 611, a substrate 612, external terminals 613, and gold wires 614. The control semiconductor chip 610 is the control unit 600 using silicon (hereafter referred to as Si) as a base material. The switch circuit semiconductor chip 611 is the signal processing unit 601 using GaAs as a base material. The control semiconductor chip 610 and the switch circuit semiconductor chip 611 are mounted next to each other on the substrate 612, and the external terminals 613 are the terminals 602. The gold wires 614 connect, without crossing and touching other wires, i) between the external terminals a to h and the switch circuit semiconductor chip 611, ii) between the external terminals i to k and the control semiconductor chip 610, and iii) between the control semiconductor chip 610 and the switch circuit semiconductor chip 611 Here, Metal-Insulator-Metal type capacitors (hereafter referred to as MIM capacitor) 630 are formed on the switch circuit semiconductor chip 611, and the MIM capacitors 630 are connected to the external terminals e to h by the gold wires 614.

FIG. 1C is a diagram showing an example of a circuit structure of the semiconductor integrated circuit component.

The circuit of the semiconductor integrated circuit component includes a logic circuit formed on the control semiconductor chip 610 and a switch circuit formed on the switch circuit semiconductor chip 611.

In the logic circuit composed of Complementary Metal-Oxide-Semiconductor contact type elements (CMOS), input terminals are connected to external terminals 613 and output terminals are connected to each gate of switch elements 631 and shunt elements 632 via resistance elements 633. Further, the logic circuit generates ON/OFF voltage applicable to control the switch elements 631 and shunt elements 632 according to an external direct current (DC) signal and apply the ON/OFF voltage to the switch elements 631 and the shunt elements 632, where the external direct current signal is a control signal inputted from the outside. Here, the external direct current signal is an electronic signal binarized into high and low voltages having about one microminute or more of rise and fall times.

The switch circuit is composed of four MIM capacitors 630 connected to earth terminals e to h, four switch elements 631 connected between terminals a to d, four shunt elements 632 whose source or drain is connected to the MIM capacitors 630, and resistance elements 633.

Here, the switch elements 631 are FET so that they become either in a high impedance state or in a low impedance state depending on the ON/OFF voltage applied by the logic circuit, and pass or cut a high frequency signal from several MHz to several tens of GHz that transmits between terminals a to d.

Furthermore, since the shunt elements 632 are FET, they become either in the high impedance state or in the low impedance state depending on the ON/OFF voltage applied by the logic circuit, and the earth terminals a to d via the MIM capacitors 630.

Next, an example of operations of the semiconductor integrated circuit component having the structure as mentioned above is explained.

As shown in FIG. 1C, when connecting between the terminal a and the terminal b, it is assumed that, among the switch elements 631 and the shunt elements 632, the switch element 631 A and the shunt elements 632 G and H are in the low impedance state that indicates a state of ON, and the switch elements 631 B, C and D and the shunt elements 632 E and F are in the high impedance state that indicates a state of OFF. At this time, the transmission of the high frequency signal between terminals is cut except between the terminal a and the terminal b only where the high frequency signal is transmitted. Here, a logic operation is previously built in the control semiconductor chip 610, and the switch circuit semiconductor chip 611 has logic states, for the logic operation, at least as many as the number of combinations among terminals to be transmitted.

Thus, the conventional semiconductor integrated circuit component realizes, by using GaAs which has a better insulation capability than Si as a base material of the switch circuit semiconductor chip, a reduction in a loss of the high frequency signal of the switch elements and the shunt elements in the state of ON, that is, a reduction of an insertion loss of the switch circuit. In addition, the conventional semiconductor integrated circuit component realizes a reduction in leakage of the high frequency signal of the switch elements and the shunt elements in the state of OFF, that is, to improve the isolation characteristic of the switch circuit. Furthermore, the conventional semiconductor integrated circuit component realizes a cost reduction by using Si whose cost is lower than that of GaAs, as the base material for the control semiconductor chip 610 which does not have transmission paths for the high frequency signal.

As mentioned above, in the conventional semiconductor integrated circuit component, GaAs, which is a rare natural material as compared with Si, is used as the base material for the switch circuit semiconductor chip. However, pluralities of switch elements, shunt elements and MIM capacitors are formed on the switch circuit semiconductor chip so that the area of the switch circuit semiconductor chip is enlarged, which causes an increase of the cost of producing the semiconductor integrated circuit component.

Also, in the conventional semiconductor integrated circuit component, the high frequency signal is transmitted via gold wires that connect the MIM capacitors to the external terminals. However, as shown in FIG. 1B, the length of the gold wires connecting the MIM capacitors to the external terminals e to h are long. Therefore, parasitic inductance by the gold wires is largely affected so as to increase the insertion loss of the switch circuit, and the isolation characteristic is deteriorated.

Further, in the conventional semiconductor integrated circuit component, in the case where an integration density of the switch circuit semiconductor chip is increased by further forming elements that are necessary for the operation of the switch circuit on the switch circuit semiconductor chip, the area of the switch circuit semiconductor chip is increased and the area of the substrate on which the switch circuit semiconductor chip is mounted is increased as well, thereby extending the size of the semiconductor integrated circuit component. In other words, the number of elements to be mounted on the switch circuit semiconductor chip is restricted by the area of the substrate on which the semiconductor chip is mounted so that the integration density of the semiconductor integrated circuit component cannot be increased without extending the size of the semiconductor integrated circuit component.

Lastly, in the conventional semiconductor integrated circuit component, the reduction of the insertion loss and the improvement of the isolation characteristic of the switch circuit are realized by using GaAs as the basic material for the switch circuit semiconductor chip. However, the insertion loss and the isolation arise from a solid-state value of the semiconductor such as an electrical conductivity and a dielectric constant, and the solid-state value has a breaking point. Therefore, the solid-state value determines the limits of the insertion loss and the isolation so that the insertion loss of the switch circuit cannot be reduced further and the isolation characteristic cannot be improved further. For example, as for the electrical conductivity, the value of the electrical conductivity of the semiconductor is $1 \times 10^3$ S/cm, which is three figures lower than the value of the electrical conductivity of the metal $1 \times 10^6$ S/cm. As for the dielectric constant, the value of the dielectric constant of the semiconductor is 12, which is a single figure higher than the value 1 of the relative dielectric constant of the air. As a result, a small insertion loss as in metal and a high isolation as in air cannot be realized in the semiconductor.

Here, a method of controlling a channel width is suggested as a method of realizing a further reduction of the insertion loss of the switch circuit and an improvement of the isolation characteristic of the switch circuit since the loss and leakage of the high frequency signal are determined by a resistance value when FET is in the state ON. However, this method cannot realize the reduction of insertion loss and the improvement of the isolation characteristic at the same time because the insertion loss and the isolation are in a tradeoff relationship. In other words, setting the channel width of FET larger lowers a resistance value in the state of ON and reduces the loss of the high frequency signal so as to increase the leakage of the high frequency signal. Also, setting the channel width of FET smaller lowers the capacitance value in the state of OFF and reduces the leakage of the high frequency so as to increase the loss of the high frequency signal.

Furthermore, a method of using only MEMS (Micro Electro Mechanical Systems) switches for manufacturing the semiconductor integrated circuit component is suggested as a method of further reducing the insertion loss of the switch circuit and improving the isolation characteristic, where the MEMS switch is a switch device using MEMS technology. For example, the MEMS switch has a small insertion loss of 0.1 dB and an isolation of 40 dB as high as that of the air which cannot be achieved by the semiconductor. However, the MEMS switch needs a micro space structure at a mechanical contact point so that a complicated manufacturing process for a space formation is required. Additionally, since conditions for the space formation to manufacture the MEMS switch need to be the same as possible, designing a space between elements and an arrangement of elements equally as possible for each element is restricted. Therefore, it is difficult to manufacture the semiconductor integrated circuit component only by using the MEMS switches. This method also cannot realize a reduction in the insertion loss and improve the isolation characteristic.

SUMMARY OF THE INVENTION

Considering the above mentioned problems, a first object to the present invention is to provide a low-cost semiconductor device comprising a semiconductor chip for processing a high frequency signal, and a semiconductor chip for controlling the high frequency signal processing.

A second object to the present invention is to provide a semiconductor device for restraining an increase of insertion loss and a deterioration of a isolation characteristic of a switch circuit resulting from parasitic inductance of gold wires.

A third object to the present invention is to provide a miniaturized semiconductor device having a high integration density.

A fourth object to the present invention is to provide a semiconductor device that has the semiconductor chip for processing the high frequency signal and the semiconductor chip for controlling the high frequency signal processing, reduces the insertion loss of the switch circuit, and increases the isolation characteristic.

To achieve the above objects, a semiconductor device of the present invention comprises: a first semiconductor chip for processing a high frequency signal, and a second semiconductor chip for controlling the high frequency signal processing performed by the first semiconductor chip. The first semiconductor chip and the second semiconductor chip are respectively made up of different materials, and the second semiconductor chip has a first element for processing the high frequency signal and a second element for controlling the first semiconductor chip. Here, a switch circuit for processing the high frequency signal is formed on the first semiconductor chip, and the first element is a capacitor to shunt the high frequency signal.

Consequently, the semiconductor device includes the first semiconductor chip for processing the high frequency signal and the second semiconductor chip for controlling the process, and can reduce the area of the semiconductor chip for processing the high frequency signal so that the low-cost semiconductor device having the semiconductor chip for processing the high frequency signal and the semiconductor chip for controlling the process can be realized.

Also, the present invention may be a semiconductor device comprising a first semiconductor chip for processing a high frequency signal, and a second semiconductor chip for controlling the high frequency signal processing performed by the first semiconductor chip. The first semiconductor chip and the second semiconductor chip are respectively made up of different materials, and the second semiconductor chip has an element for controlling the first semiconductor chip and a MEMS switch for processing the high frequency signal.

Accordingly, the semiconductor device includes the first semiconductor chip for processing the high frequency signal and the second semiconductor chip for controlling the process, and replaces one of the elements for processing the high frequency signal to the MEMS switch so that the semiconductor device can be realized. The semiconductor device includes the semiconductor chip for processing the high frequency signal and the semiconductor chip for controlling the process, and has an acceptable insertion loss and isolation characteristic.

Further, either one of the first semiconductor chip or the second semiconductor chip can be placed on the other.

For this reason, the length of gold wires can be shortened, where the gold wires connect between the semiconductor chips and between the semiconductor chip and the substrate. Therefore, the semiconductor device for restraining the insertion loss and the isolation characteristic resulting from the parasitic inductance of gold wires can be realized.

The semiconductor device further comprises a substrate on which at least one of the first semiconductor chip and the second semiconductor chip is mounted. At least one of the element with which the first semiconductor chip processes the high frequency signal and the element for controlling the high frequency signal processing performed by the first semiconductor chip may be formed inside the substrate.

Consequently, the elements formed on the semiconductor chips can be moved to inside of the substrate so that the miniaturized semiconductor device having a high integration density can be realized.

As is clear from the above explanation, the semiconductor integrated circuit component according to the present invention has the switch circuit semiconductor chip for processing the high frequency signal and the control semiconductor chip for controlling the process, wherein the MIM capacitor which was formed on the switch circuit semiconductor made of high-priced GaAs as the base material is formed on the control semiconductor chip made of low-cost Si as the base material. Therefore, the low-cost semiconductor integrated circuit component can be realized having the semiconductor chip for processing the high frequency signal and the semiconductor chip for controlling the process. Also, according to the semiconductor integrated circuit component of the present invention, the switch circuit semiconductor chip is mounted on the control semiconductor chip so that the semiconductor integrated circuit component for restraining the increase of insertion loss of the switch circuit and the deterioration of the isolation characteristic resulting from the parasitic inductance of gold wires can be realized. Further, according to the semiconductor integrated circuit component of the present invention, elements formed on the control semiconductor chip or the switch circuit semiconductor chip are formed inside the substrate so that a miniaturized semiconductor integrated circuit component having a high integration density can be realized. Furthermore, the semiconductor integrated circuit component according to the present invention has the semiconductor chip for processing the high frequency signal and the control semiconductor chip for controlling the process, and replaces one of the switch elements with the MEMS switch so that the semiconductor integrated circuit component is realized, the semiconductor integrated circuit component having the semiconductor chip for processing the high frequency signal and the semiconductor chip for controlling the process, reducing the insertion loss of the switch circuit, and improving the isolation characteristic.

Accordingly, the present invention can provide either the low-cost miniaturized semiconductor integrated circuit component including the semiconductor chip for processing the high frequency signal and the semiconductor chip for controlling the process, restraining the increase of insertion loss of the switch circuit and the deterioration of the isolation characteristic resulting from the parasitic inductance of gold wires, and having a high integration density, or the semiconductor integrated circuit component including the semiconductor chip for processing the high frequency signal and the semiconductor chip for controlling the process, reducing the insertion loss of the switch circuit, and improving the isolation characteristic. Thus, the practical value of the present invention is quite high.

As further information about the technical background to this application, the disclosure of Japanese Patent Application No. 2003-287019 filed on Aug. 5, 2003 including the specification, drawings and claims is incorporated herein by reference in its entirety.

BRIEF DESCRIPTION OF THE DRAWINGS

These and other objects, advantages and features of the invention will become apparent from the following description thereof when taken in conjunction with the accompanying drawings that illustrate specific embodiments of the invention. In the Drawings.

DETAILED DESCRIPTION OF THE PREFERRED EMBODIMENTS

The following explains a semiconductor integrated circuit component according to embodiments of the present invention with reference to the drawings.

First Embodiment

Figure 1A:
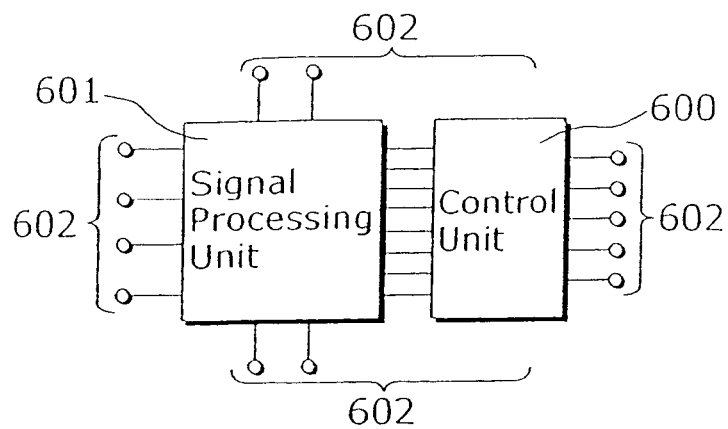
FIG. 1A is a functional block diagram of a conventional semiconductor integrated circuit component.
Figure 1B:
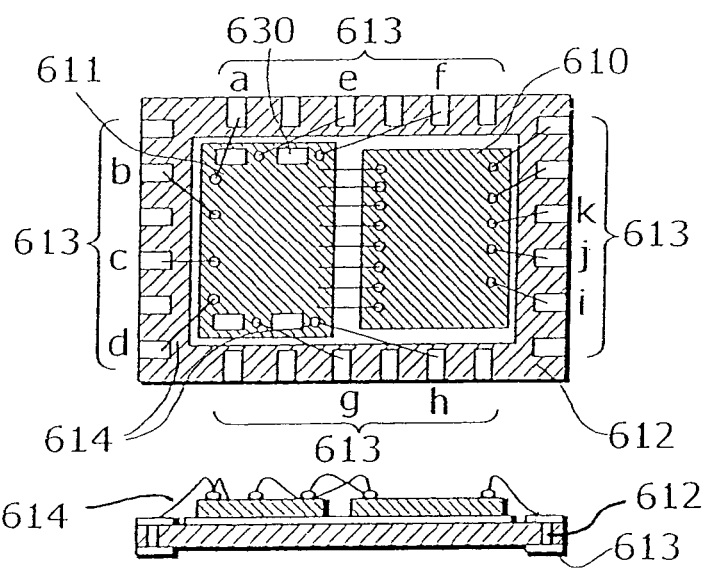
FIG. 1B is an external drawing of the conventional semiconductor integrated circuit component.
Figure 1C:
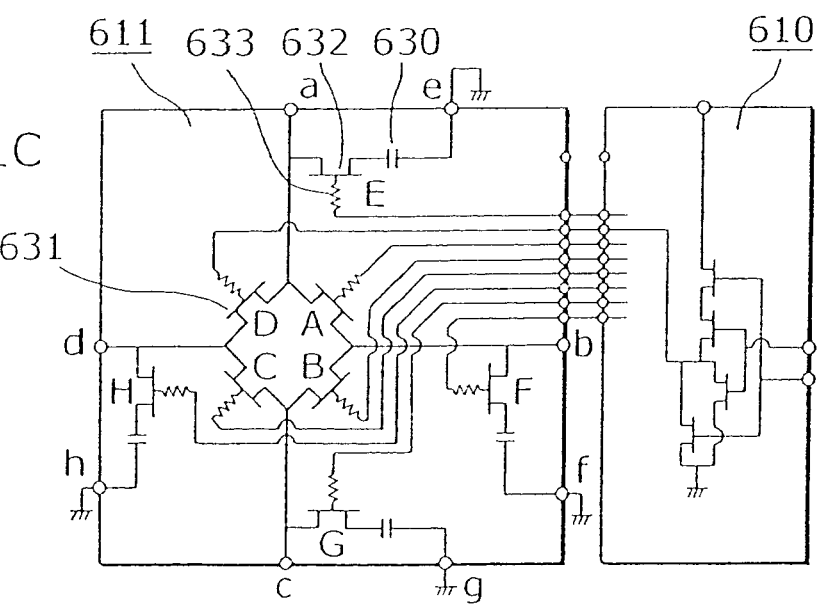
FIG. 1C is a diagram showing an example of a circuit structure of the conventional semiconductor integrated circuit component.
Figure 2A:
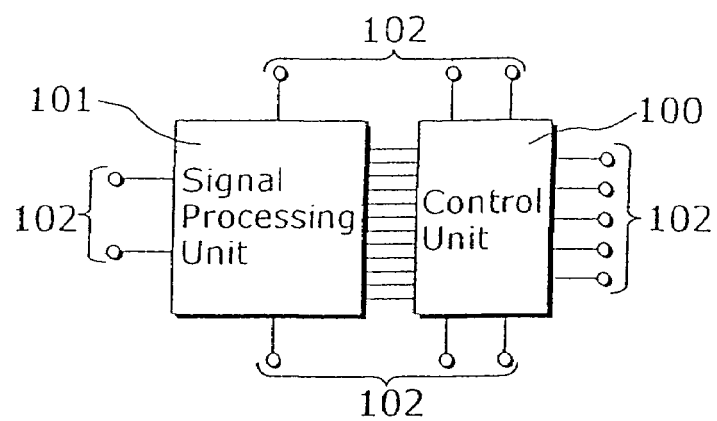
FIG. 2A is a functional block diagram of a semiconductor integrated circuit component according to the first embodiment of the present invention.

FIG. 2A is a functional block diagram showing an internal structure of a semiconductor integrated circuit component according to the first embodiment of the present invention.

The semiconductor integrated circuit component aims to realize a low-cost semiconductor integrated circuit component having a semiconductor chip for processing a high frequency signal and a semiconductor chip for controlling the high frequency signal processing. The semiconductor integrated circuit component is composed of a control unit 100, a signal processing unit 101 and terminals 102. The control unit 100 controls the signal processing unit 101 based on a signal inputted from the outside (i.e., an externally inputted signal). The signal processing unit 101 is connected to the control unit 100 and performs a switching operation of the high frequency signal. The terminals 102 are interfaces between the control unit 100 and the signal processing unit 101, and the outside.

Figure 2B:
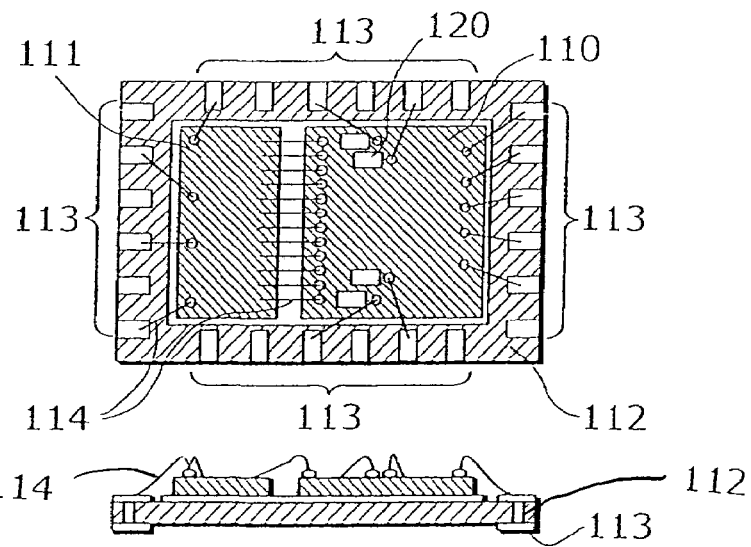
FIG. 2B is an external drawing of the semiconductor integrated circuit component according to the first embodiment.

FIG. 2B is an external drawing of the semiconductor integrated circuit component.

The semiconductor integrated circuit component of the first embodiment differs from the conventional semiconductor integrated circuit component in that MIM capacitors 120 are formed on a control semiconductor chip 110. The semiconductor integrated circuit includes the control semiconductor chip 110, a switch circuit semiconductor chip 111, a substrate 112, external terminals 113 and gold wires 114. The control semiconductor chip 110 is the control unit 100 using Si as the base material. The switch circuit semiconductor chip 111 is the signal processing unit 101 using GaAs as the base material. The switch circuit semiconductor chip 111 and the control semiconductor chip 110 are mounted next to each other on the substrate 112. The external terminals 113 are the terminals 102, and the gold wires connect among the control semiconductor chip 110, the switch circuit semiconductor chip 111 and the external terminals 113.

Figure 2C:
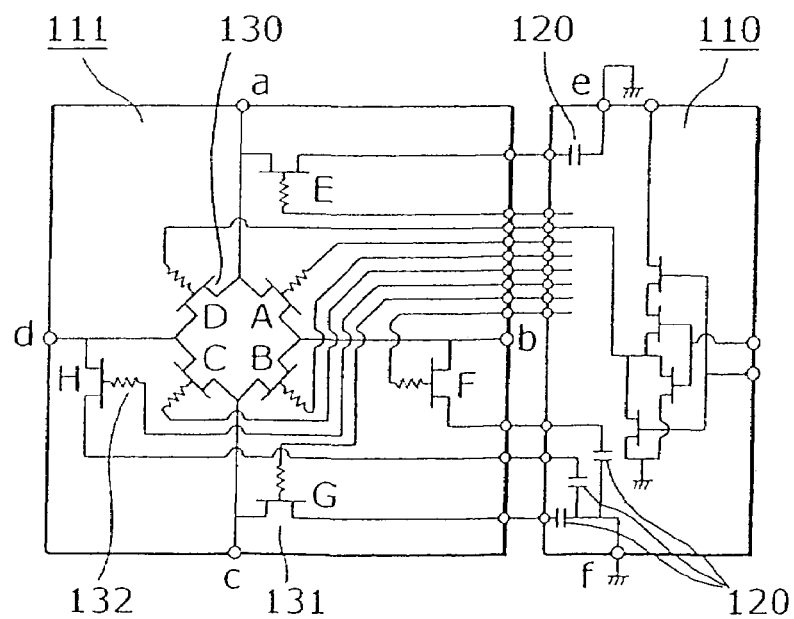
FIG. 2C is a diagram showing an example of a circuit structure of the semiconductor integrated circuit component according to the first embodiment.

FIG. 2C is a diagram showing an example of a circuit structure of the semiconductor integrated circuit component according to the first embodiment.

The circuit of the semiconductor integrated circuit component has a logic circuit formed on the control semiconductor chip 110 and a switch circuit formed on the switch circuit semiconductor chip 111.

The logic circuit is composed of CMOS, the logic circuits having input terminals which are respectively connected to the external terminals 113, and output terminals which are connected to the gates of the switch elements 130 and the shunt elements 131 via resistance elements 132. In addition, the logic circuit generates ON/OFF voltage applicable for controlling the switch elements 130 and the shunt elements 131 according to the external direct current (DC) signal inputted from the outside and applies the ON/OFF voltage to the switch elements 130 and the shunt elements 131.

The switch circuit is composed of four MIM capacitors 120 connected to the earth terminal e or the earth terminal f, four switch elements 130 connecting among terminals a, b, c and d, the four shunt elements 131 whose source or drain is connected to the MIM capacitors 120, and the resistance elements 132. Here, the four MIM capacitors 120 are formed on the control semiconductor chip 110, and the four switch elements 130, the four shunt elements 131 and the resistance elements 132 are formed on the switch circuit semiconductor chip 111.

The switch elements are FET so that the switch elements become either in a high impedance state or in a low impedance state according to the ON/OFF voltage applied by the logic circuit and pass or cut the high frequency signal of several MHz to several tens of GHz transmitting among terminals a, b, c and d.

The shunt elements are FET so that the shunt elements become either in a high impedance state or in a low impedance state according to the ON/OFF voltage applied by the logic circuit and earths terminals a, b, c and d via the MIM capacitors 120.

Next, an example of operations of the semiconductor integrated circuit component having a structure as mentioned above is explained.

As shown in FIG. 2C, when connecting between the terminal a and the terminal b, it is assumed that the switch element 130 A and the shunt elements 131 G and H are in the state of ON, and the switch elements 130 B, C and D and the shunt elements 131 E and F are in the state of OFF. At this time, the transmissions of the high frequency signal among terminals are cut except between the terminal a and the terminal b where the high frequency signal is transmitted. Here, the logic operation is previously built in the control semiconductor chip 110, and the switch circuit semiconductor chip 111 has a number of logic states, for the logic operation, for as many as the number of combinations among terminals at least to be transmitted.

As described above, according to the semiconductor integrated circuit component of the first embodiment, the semiconductor integrated circuit component has the switch circuit semiconductor chip 111 and the control semiconductor chip 110, and the MIM capacitors 120 are formed on the control semiconductor chip 110. As a result, the area of the switch circuit semiconductor chip 111 can be reduced. Therefore, the semiconductor integrated circuit component of the first embodiment can realize a low-cost semiconductor integrated circuit component having a semiconductor chip for processing the high frequency signal and a semiconductor chip for controlling the high frequency signal processing. That is, the area of the switch circuit semiconductor chip 111 using GaAs as the base material is reduced 15% by forming four MIM capacitors 120 on the control semiconductor chip 110. Also, the area of the control semiconductor chip 110 using Si, which costs one-fifth of the cost of GaAs as the base material, is increased as much as the reduced area so that the price of the semiconductor integrated circuit component can be reduced by 13%.

Here, in the semiconductor integrated circuit component of the first embodiment, the MIM capacitors 120 are formed on the control semiconductor chip 110. However, the MIM capacitors 120 can also be formed on another semiconductor chip having completely different functions.

Additionally, in the semiconductor integrated circuit component of the first embodiment, the MIM capacitors 120 are formed on the control semiconductor chip 110. However, elements other than the MIM capacitors 120 can be formed on the control semiconductor chip 110.

Furthermore, in the semiconductor integrated circuit component of the first embodiment, the semiconductor integrated circuit component includes the control unit 100, the signal processing unit 101 and terminals 102. However, the semiconductor integrated circuit component may further have other functions such as an amplifier.

Second Embodiment

Figure 3:
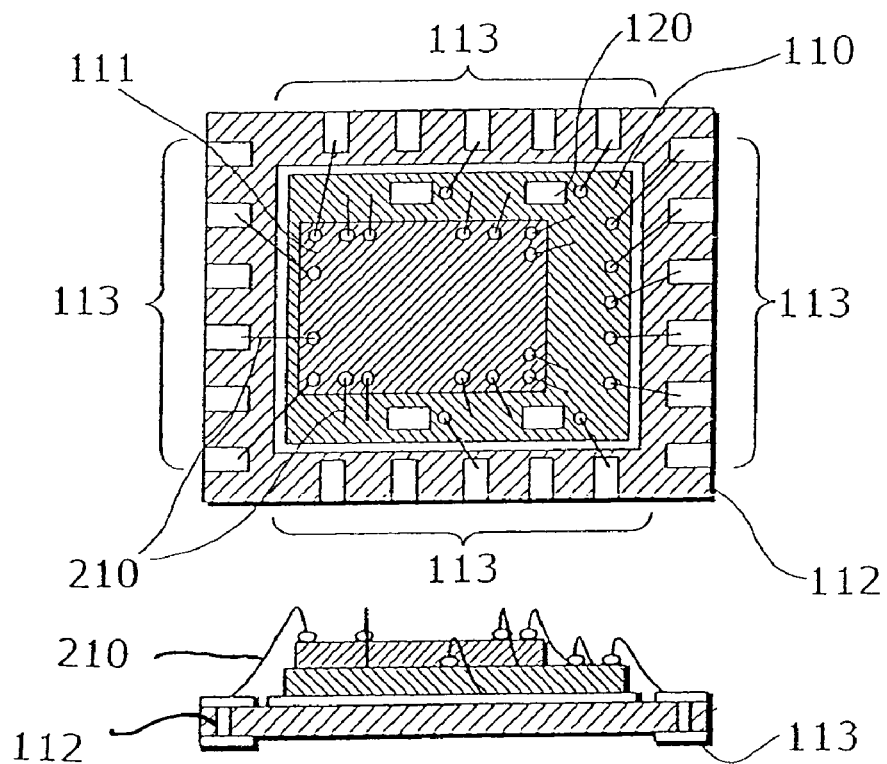
FIG. 3 is an external drawing of a semiconductor integrated circuit component according to the second embodiment of the present invention.

FIG. 3 is an external drawing of a semiconductor integrated circuit component according to the second embodiment of the present invention. In FIG. 3, the same elements as in FIG. 2B are denoted with the same reference numerals as in FIG. 2B and a detailed explanation thereof is omitted here.

The semiconductor integrated circuit component of the second embodiment aims to realize a semiconductor integrated circuit component for restraining an increase of the insertion loss and a deterioration of the isolation characteristic of a switch circuit resulting from the parasitic inductance of gold wires. While not mounting the control semiconductor chip and the switch circuit semiconductor chip next to each other on the substrate, the semiconductor integrated circuit component of the second invention differs from the semiconductor integrated circuit component of the first embodiment in that the control semiconductor chip is mounted on a substrate and the switch circuit semiconductor chip is mounted on the control semiconductor chip. The semiconductor integrated circuit component is composed of a control semiconductor chip 110 mounted on a substrate 112, a switch circuit semiconductor chip 111, a substrate 112, external terminals 113, and gold wires 210. The switch circuit semiconductor chip 111 is mounted on the control semiconductor chip 110 via dielectric paste, and the gold wires 210 connect among the control semiconductor chip 110, the switch circuit semiconductor chip 111 and the external terminals 113. Here, the MIM capacitors 120 are formed on the control semiconductor chip 110. Also, the total length of the gold wires 210 connecting the switch circuit semiconductor chip 111 to the MIM capacitors 120 and the gold wires 210 connecting the external terminals 113 and the MIM capacitors 120 are a half to two-fifth of the total length of the same gold wires used in the semiconductor integrated circuit component according to the first embodiment. Here, the switch circuit semiconductor chip 111 is mounted on the control semiconductor chip 110 via the dielectric paste. However, the second embodiment is not limited to this so long as insulation is maintained between the control semiconductor chip 110 and the switch circuit semiconductor chip 111 and the switch circuit semiconductor chip 111 is fixed on the control semiconductor chip 110.

Figure 4:
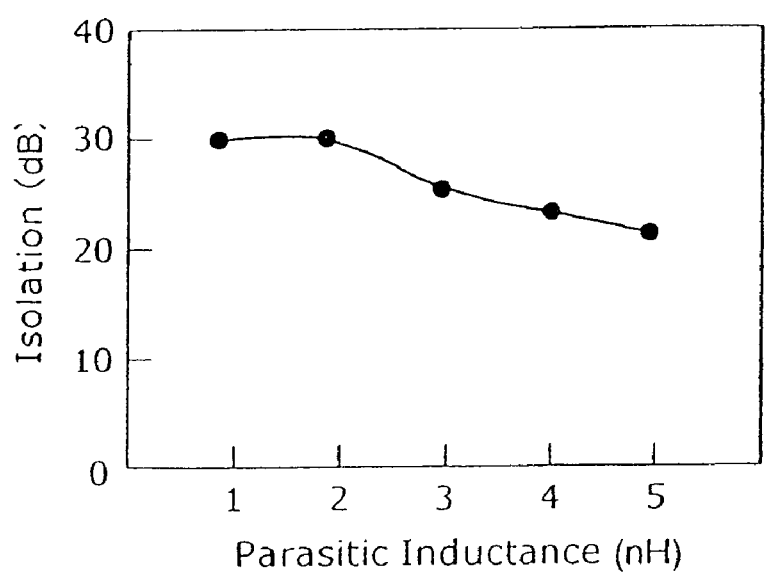
FIG. 4 is a diagram showing a relationship of parasitic inductance of gold wires 210 with a value of calculating isolation of the gold wires 210 at the frequency of 2 GHz of the semiconductor integrated circuit component according to the second embodiment.

FIG. 4 is a graph showing a relationship of parasitic inductance of the gold wires 210 and a value of calculating the isolation characteristic at 2 GHz frequency. As described above, the gold wires 210 connect the switch circuit semiconductor chip 111 to the MIM capacitors 120 and the external terminals 113 to the MIM capacitors 120. Here, the parasitic inductance of the same gold wires as in the semiconductor integrated circuit component according to the first embodiment is 5 nH at 2 GHz, and the parasitic inductance of gold wires 210 of the semiconductor integrated circuit component according to the second embodiment is 2 to 2.5 nH at 2 GHz.

FIG. 4 indicates that the value of the isolation characteristic of the semiconductor integrated circuit component according to the first embodiment is 22 dB, and the value of the isolation characteristic of the semiconductor integrated circuit component according to the second embodiment is 28 dB to 30 dB. Thus, the isolation characteristic is largely improved by mounting the switch circuit semiconductor chip 111 on the control semiconductor chip 110.

As described above, in the semiconductor integrated circuit component of the second embodiment, the switch circuit semiconductor chip 111 is mounted on the control semiconductor chip 110. As a result, the outer edge of the switch circuit semiconductor chip 111 and the outer edge of the control semiconductor chip 110 are close to each other, and the outer edge of the control semiconductor chip 111 as a whole is close to the external terminals 113. Accordingly, the total length of the gold wires 210 connecting between the switch circuit semiconductor chip 111 and the MIM capacitors 120, and the gold wires 210 connecting the external terminals 113 to the MIM capacitors 120 can be shortened. Therefore, the semiconductor integrated circuit component of the second embodiment can realize a semiconductor integrated circuit component for restraining an increase of the insertion loss and a deterioration of the isolation characteristic of the switch circuit resulting from the component of the parasitic inductance of gold wires.

Also, in the semiconductor integrated circuit component of the second embodiment, the switch circuit semiconductor chip 111 is mounted on the control semiconductor chip 110. Accordingly, the outer edge of the switch circuit semiconductor chip 111 and the outer edge of the control semiconductor chip 110 are close to each other, and the outer edge of the control semiconductor chip 110 as a whole is close to the external terminals 113. That is, the area of arrangement of the MIM capacitors 120 is extended so that the total length of the gold wires 210 are shortened, the total length of the gold wires 210 connecting between the switch circuit semiconductor chip 111 and the MIM capacitors 120 and the gold wires 210 connecting the external terminals 113 to the MIM capacitors 120. Therefore, the semiconductor integrated circuit component of the second embodiment can realize the semiconductor integrated circuit component that can determine the area of arrangement of the MIM capacitors with high degree of freedom.

Furthermore, in the semiconductor integrated circuit component of the second embodiment, the switch circuit semiconductor chip 111 is mounted on the control semiconductor chip 110. As a result, the area of the substrate 112 is reduced so that the semiconductor integrated circuit component of the second embodiment can realize the miniaturized semiconductor integrated circuit component.

Third Embodiment

Figure 5A:
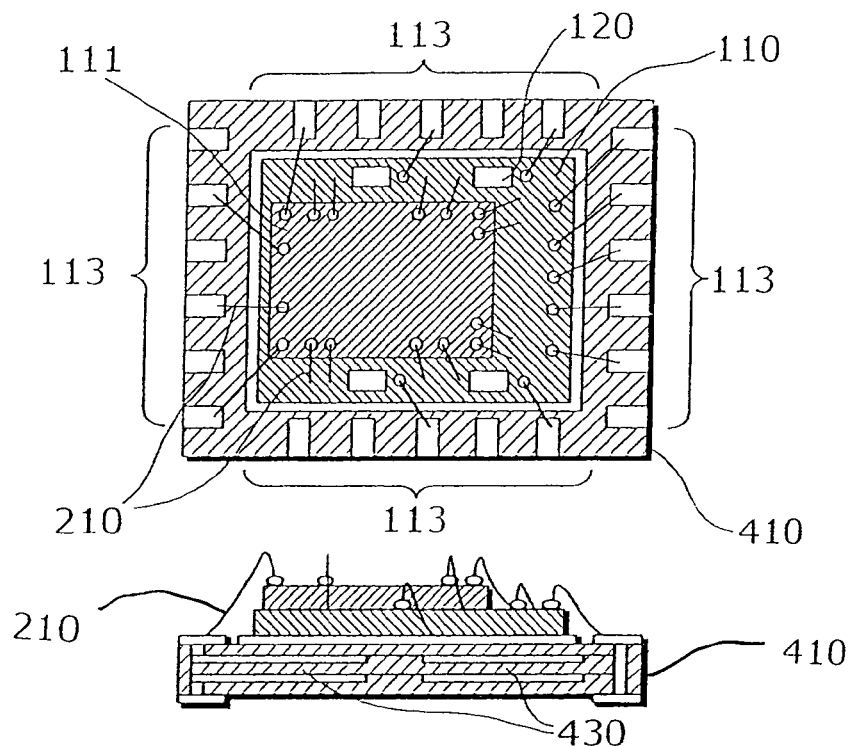
FIG. 5A is an external drawing of a semiconductor integrated circuit component according to the third embodiment of the present invention.

FIG. 5A is an external drawing of a semiconductor integrated circuit component according to the third embodiment of the present invention. In FIG. 5A, the same components as in FIG. 3 are denoted with the same reference numerals as in FIG. 3 and a detailed explanation thereof is omitted here.

The semiconductor integrated circuit component of the third embodiment aims to realize a miniaturized semiconductor integrated circuit component with a high integration density. The semiconductor integrated circuit component of the third embodiment differs with the semiconductor integrated circuit component of the second embodiment in that the switch circuit further includes the MIM capacitors, and the MIM capacitors are formed inside the substrate. The semiconductor integrated circuit component of the third embodiment is composed of the control semiconductor chip 110, a switch circuit semiconductor chip 111, a substrate 410, external terminals 113 and gold wires 210. Here, the substrate 410 is a low temperature fired multi-layered ceramic substrate, and MIM capacitors 430 with 5 pF are formed inside the substrate.

Figure 5B:
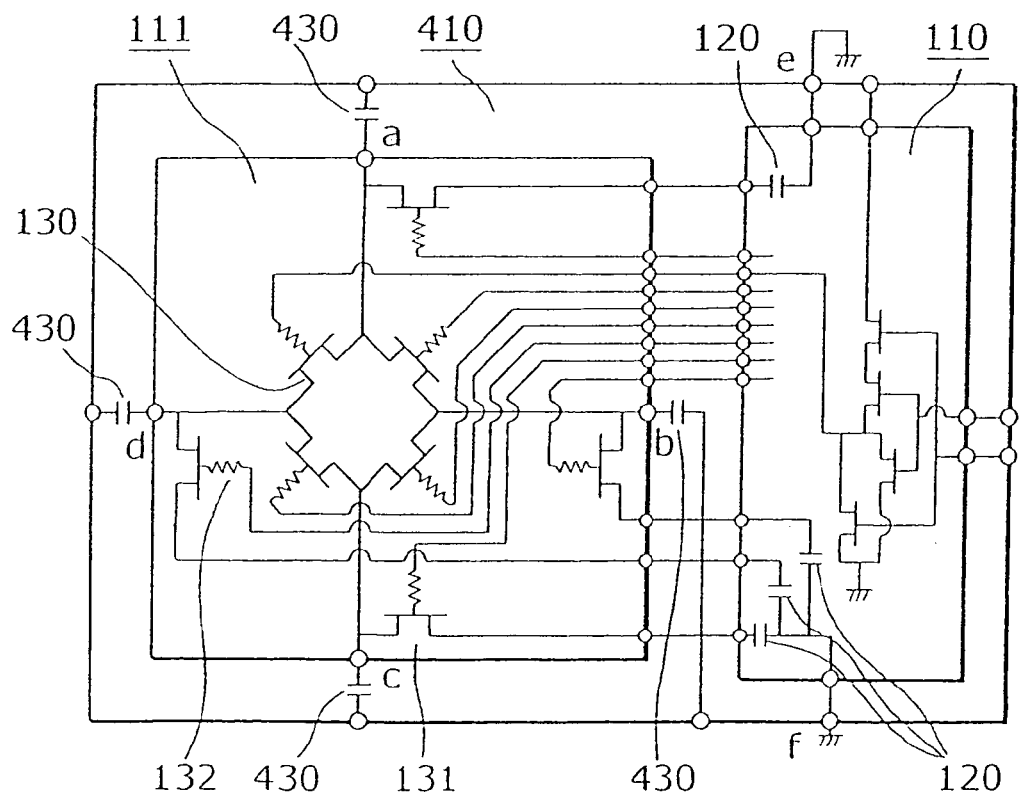
FIG. 5B is a diagram showing an example of a circuit structure of a semiconductor integrated circuit component according to the third embodiment.

FIG. 5B is a diagram showing an example of a circuit structure of the semiconductor integrated circuit component. The same components as in FIG. 2C are denoted with the same reference numerals as in FIG. 5B and a detailed explanation thereof is omitted here.

The circuit of the semiconductor integrated circuit component includes a logic circuit formed on the control semiconductor chip 110 and a switch circuit formed on the switch circuit semiconductor chip 111, the control semiconductor chip 110 and inside the substrate 410.

The switch circuit is composed of four MIM capacitors 120, four switch elements 130, four shunt elements 131, resistance elements 132 and four MIM capacitors 430 for cutting direct current. Here, i) the four MIM capacitors 120 are formed on the control semiconductor chip 110, ii) the four switch elements 130, the four shunt elements 131 and the resistance elements 132 are formed on the switch circuit semiconductor chip 111, and iii) the four MIM capacitors 430 are formed inside the substrate 410.

As described above, in the semiconductor integrated circuit component of the third embodiment, the MIM capacitors 430 are formed inside the substrate 410, the MIM capacitors being elements that are necessary for performing an operation of a switch circuit. That is, more elements necessary for performing the operation of the switch circuit can be mounted without increasing the area of the substrate 410. Therefore, the semiconductor integrated circuit component of the third embodiment can realize the miniaturized semiconductor integrated circuit component with a high integration density.

Here, in the semiconductor integrated circuit component of the third embodiment, the MIM capacitors 430 are described as being formed inside the substrate 410. However, other elements can also be formed inside the substrate 410 if they are the elements to be formed on the control semiconductor chip 110 or the switch circuit semiconductor chip 111.

Fourth Embodiment

Figure 6A:
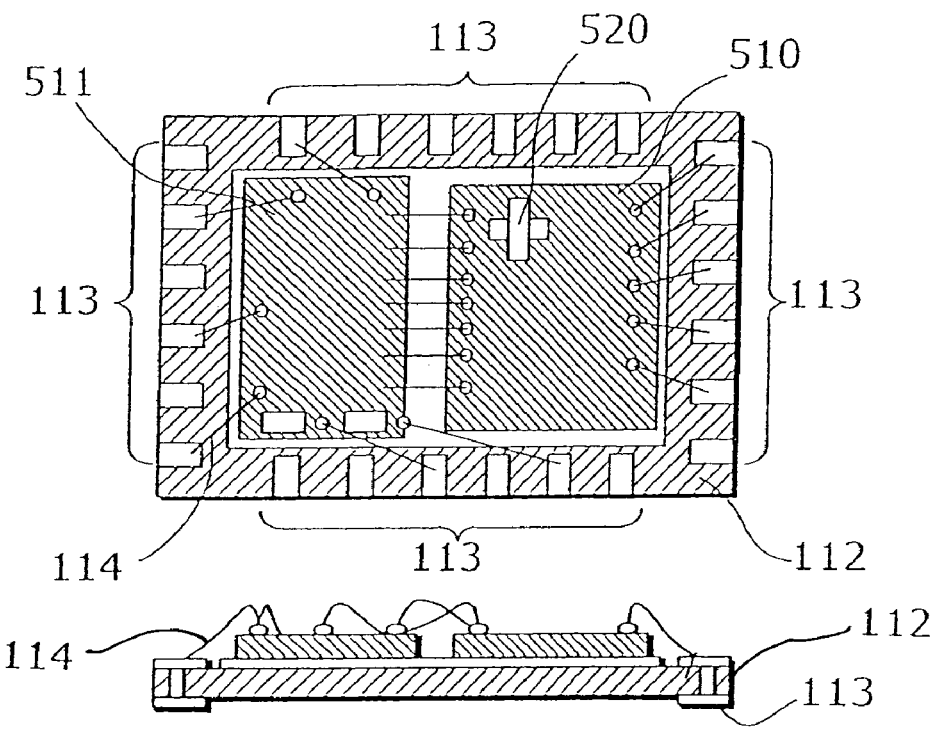
FIG. 6A is an external drawing of a semiconductor integrated circuit component according to the fourth embodiment of the present invention.

FIG. 6A is an external drawing of the semiconductor integrated circuit component according to the fourth embodiment of the present invention. In FIG. 6A, the same components as in FIG. 2B are denoted with the same reference numerals as in FIG. 2B and a detailed explanation thereof is omitted here.

The semiconductor integrated circuit component of the fourth embodiment aims to realize a semiconductor integrated circuit component that i) has a semiconductor chip for processing a high frequency signal and a semiconductor chip for controlling the high frequency signal processing, ii) reduces the insertion loss of a switch circuit, and iii) improves the isolation characteristic. The semiconductor integrated circuit component of the fourth embodiment differs with the conventional semiconductor integrated circuit component in that one of the switch elements is a MEMS switch and the switch elements are formed on the control semiconductor chip. The semiconductor integrated circuit component is composed of a control semiconductor chip 510 using Si as the base material, a switch circuit semiconductor chip 511 using GaAs as the base material, the substrate 112, the external terminals 113 and the gold wires 114. Here, a switch element 520 is formed on the control semiconductor chip 510.

Figure 6B:
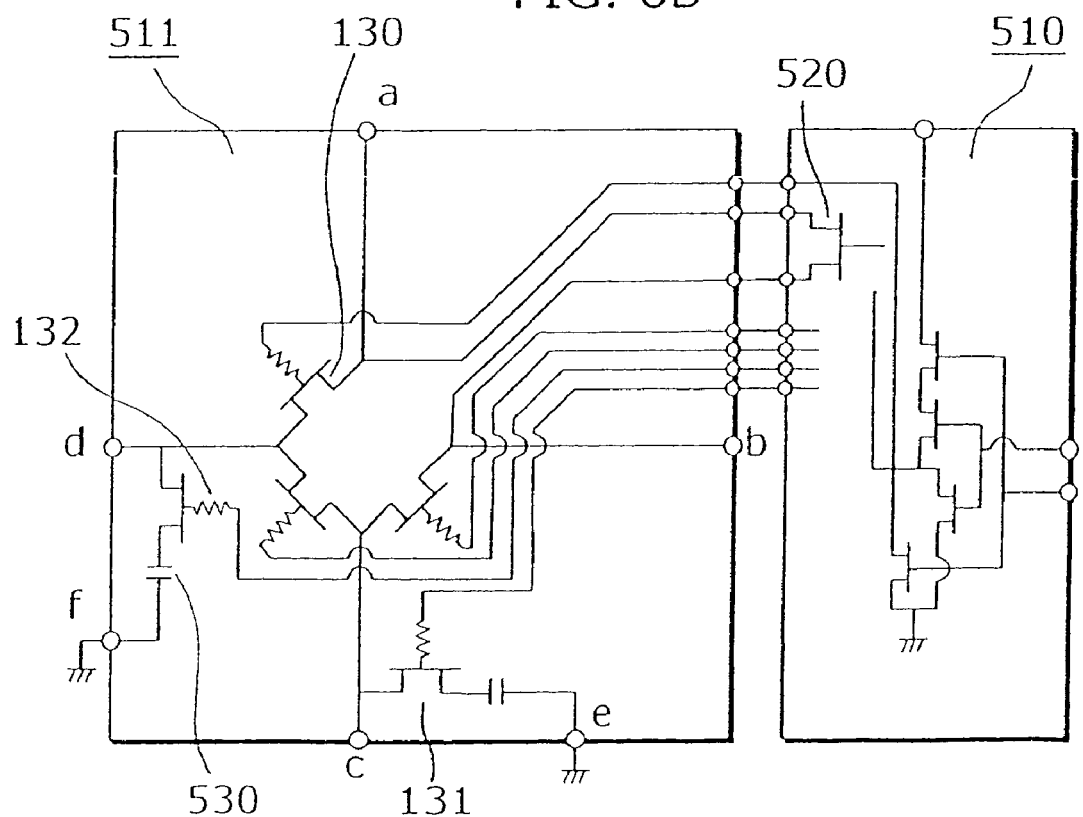
FIG. 6B is a diagram showing an example of a circuit structure of the semiconductor integrated circuit component according to the fourth embodiment.

FIG. 6B is a diagram showing an example of a circuit structure of the semiconductor integrated circuit component. In FIG. 6B, the same components as in FIG. 2C are denoted with the same reference numerals as in FIG. 2C, and a detailed explanation thereof is omitted here.

The circuit of the semiconductor integrated circuit component includes a logic circuit formed on the control semiconductor chip 510, a switch circuit formed on the control semiconductor chip 510, and the switch circuit semiconductor chip 511.

In the logic circuit composed of CMOS, i) input terminals are connected to the external terminals 113, and ii) output terminals are connected, via the resistance elements 132, to the each gate of the switch elements 130, the shunt elements 131 and the switch element 520. Also, the logic circuit i) generates ON/OFF voltage applicable for controlling the switch element 130, the shunt elements 131 and the switch element 520 according to the external direct current signal inputted from the outside, and ii) applies the ON/OFF voltage to the switch elements 130, the shunt elements 131 and the switch element 520.

The switch circuit is composed of three switch elements 130 connecting among terminals a, c and d, two shunt elements 131 whose source or drain is connected to the MIM capacitors 530, the resistance elements 132, the switch element 520 connecting between the terminal a and the terminal b, and two MIM capacitors 530 connected to the earth terminal e and the earth terminal f. Here, the two MIM capacitors 530, three switch elements 130, two shunt elements 131 and resistance elements 132 are formed on the switch circuit semiconductor chip 511, and the switch element 520 is formed on the control semiconductor chip 510.

The switch element 520 is a MEMS switch so that it becomes a state of having mechanical contacts according to the ON voltage applied by the logic circuit and becomes a state without the mechanical contacts according to the OFF voltage applied by the logic circuit. Therefore, the switch element 520 passes or cuts the high frequency signal of several MHz to several tens of GHz that transmits between the terminal a and the terminal b. Here, a detailed explanation about the MEMS switch is, for example, provided in Japanese Laid-Open Patent Publication application No. 9-17300.

As described above, in the semiconductor integrated circuit component of the fourth embodiment, the semiconductor integrated circuit component has the control semiconductor chip 510 and the switch circuit semiconductor chip 511 wherein one of the switch elements is the MEMS switch. Therefore, one of the switch elements is not restricted by the characteristic resulting from a physical property of a semiconductor. As a result, the semiconductor integrated circuit component of the fourth embodiment can realize a semiconductor integrated circuit component that i) has a semiconductor chip for processing the high frequency signal and a semiconductor chip for controlling the high frequency signal processing, ii) reduces the insertion loss of the switch circuit, and iii) improves the isolation characteristic. For example, in a path using the MEMS switch, a result shows that the value of the insertion loss is 0.1 dB at 2 GHz frequency and the value of the isolation is 40 dB at 2 GHz frequency.

Also, in the semiconductor integrated circuit component of the fourth embodiment, only one of the switch elements is the MEMS switch, and the MEMS switch is formed on the control semiconductor chip 510 using Si whose cost is lower than that of GaAs as a base material. Thus, the semiconductor integrated circuit component can restrain an increase of defectiveness generated in the process of forming the MEMS switch and the cost up by the defectives. Therefore, the semiconductor integrated circuit component of the fourth embodiment can realize a semiconductor integrated circuit component that can control increases in cost by a yield caused in the MEMS switch formation.

Here, in the semiconductor integrated circuit component of the fourth embodiment, the control semiconductor chip 510 and the switch circuit semiconductor chip 511 are mounted next to each other on the substrate 112. However, the control semiconductor chip 510 can also be mounted on the substrate 112, and the switch circuit semiconductor chip 511 can be mounted on the control semiconductor chip 510.

Further, in the semiconductor integrated circuit component of the fourth embodiment, elements such as MIM capacitors can be formed inside the substrate 112, the elements being formed on the control semiconductor chip 510 or the switch circuit semiconductor chip 511.

Although only some exemplary embodiments of the present invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The semiconductor device according to the present invention can be applied to a communication device, a radio equipment and the like that need a low-cost semiconductor integrated circuit component having a semiconductor chip for processing the high frequency signal and a semiconductor chip for controlling the high frequency signal processing.

What is claimed is:

1. A semiconductor device comprising:
   a first semiconductor chip for processing a high frequency signal, said first semiconductor chip including:
      a first terminal and a second terminal for inputting and outputting the high frequency signal;
      a first switch on a signal path between said first terminal and said second terminal; and
      a second switch connected to a signal path between said first switch and said first terminal; and
   a second semiconductor chip for controlling the high frequency signal processing performed by said first semiconductor chip, said first semiconductor chip and said second semiconductor chip being respectively made of different materials, said second semiconductor chip including:
      a ground terminal connected to said second switch;
      a capacitor on a signal path between said ground terminal and said second switch; and
      a circuit which controls ON and OFF of said first switch and said second switch.

2. The semiconductor device of claim 1, wherein said first semiconductor chip is made of GaAs, and said second semiconductor chip is made of Si.

3. The semiconductor device of claim 2, further comprising a substrate on which said first semiconductor chip and said second semiconductor chip are located, wherein said substrate includes external terminals to which said first terminal, said second terminal, and said ground terminal are connected via respective wires.

4. The semiconductor device of claim 3, wherein said external terminals are arranged at a periphery of said substrate, said first terminal and said second terminal are arranged at a periphery of said first semiconductor chip, and said ground terminal is arranged at a periphery of said second semiconductor chip.

5. The semiconductor device of claim 4, wherein said substrate includes a capacitor connected to one of said external terminals.

6. The semiconductor device of claim 5, wherein said first semiconductor chip is located on said second semiconductor chip.

7. The semiconductor device of claim 1, further comprising a substrate on which said first semiconductor chip and said second semiconductor chip are located, wherein said substrate includes external terminals to which said first terminal, said second terminal, and said ground terminal are connected via respective wires.

8. The semiconductor device of claim 7, wherein said external terminals are arranged at a periphery of said substrate, said first terminal and said second terminal are arranged at a periphery of said first semiconductor chip, and said ground terminal is arranged at a periphery of said second semiconductor chip.

9. The semiconductor device of claim 7, wherein said substrate further includes a capacitor connected to one of said external terminals.

10. The semiconductor device of claim 1, wherein said first semiconductor chip is located on said second semiconductor chip.

* * * * *